(12) United States Patent
McCurley et al.

(10) Patent No.: US 9,820,402 B2
(45) Date of Patent: Nov. 14, 2017

(54) SLIDE LOCK FOR CIRCUIT BOARDS

(71) Applicants: Matthew Robert McCurley, Atlanta, GA (US); Paul Wayne Lewis, Jr., Sharpsburg, GA (US)

(72) Inventors: Matthew Robert McCurley, Atlanta, GA (US); Paul Wayne Lewis, Jr., Sharpsburg, GA (US)

(73) Assignee: Cooper Technologies Company, Houston, TN (US)

(*) Notice: Subject to any disclaimer, the term of this patent is extended or adjusted under 35 U.S.C. 154(b) by 0 days.

(21) Appl. No.: 14/815,047

(22) Filed: Jul. 31, 2015

(65) Prior Publication Data

US 2017/0034941 A1    Feb. 2, 2017

(51) Int. Cl.
  *H05K 7/14* (2006.01)
  *H05K 1/02* (2006.01)
  *H01R 12/70* (2011.01)

(52) U.S. Cl.
  CPC ............ *H05K 7/1417* (2013.01); *H05K 1/02* (2013.01); *H01R 12/7005* (2013.01)

(58) Field of Classification Search
  CPC ........ H05K 7/142; H05K 3/366; H05K 3/301; H05K 3/325; G06F 1/184; H01R 12/7005; H01R 12/721
  See application file for complete search history.

(56) References Cited

U.S. PATENT DOCUMENTS

| | | | |
|---|---|---|---|
| 3,927,707 A * | 12/1975 | Wright | F16B 37/041 411/174 |
| 4,490,422 A | 12/1984 | Pascher | |
| H000921 H | 5/1991 | Wannemacher, Jr. | |
| 5,148,350 A | 9/1992 | Chan | |
| 5,458,497 A * | 10/1995 | Yasumura | H01R 12/721 439/341 |
| 5,612,680 A | 3/1997 | DeSanto | |
| 5,691,504 A * | 11/1997 | Sands | G06F 1/182 174/372 |
| D415,112 S | 10/1999 | Henry | |
| 6,005,775 A * | 12/1999 | Chiu | H05K 7/142 361/736 |
| D432,096 S | 10/2000 | Jeon | |
| 6,398,121 B1 | 6/2002 | Morgan | |
| 6,544,047 B2 * | 4/2003 | Moore | H01R 4/64 174/376 |
| D525,213 S | 7/2006 | Enderlein | |
| D541,752 S | 5/2007 | Van Haaste | |
| D557,668 S | 12/2007 | Sisson | |

(Continued)

*Primary Examiner* — Dimary Lopez Cruz
*Assistant Examiner* — Abhishek Rathod
(74) *Attorney, Agent, or Firm* — King & Spalding LLP

(57) ABSTRACT

A circuit board is described herein. The circuit board can include a body and at least one enclosure coupling feature disposed in at least one outer side of the body. The at least one enclosure coupling feature can include at least one protruding section disposed adjacent to the at least one outer side of the body, where the at least one protruding section is configured to couple to at least one first circuit board coupling feature of an enclosure. The at least one enclosure coupling feature can also include at least one recessed section disposed adjacent to the at least one protruding section. The at least one protruding section and the at least one recessed section can form an aperture that traverses a thickness of the body.

7 Claims, 8 Drawing Sheets

(56) References Cited

U.S. PATENT DOCUMENTS

| | | | |
|---|---|---|---|
| D574,338 S | 8/2008 | Karlicek | |
| 2002/0121008 A1* | 9/2002 | Meyer | H05K 7/142 24/453 |
| 2004/0120126 A1* | 6/2004 | Chen | H05K 7/142 361/759 |
| 2004/0257783 A1* | 12/2004 | Hsu | H05K 7/142 361/801 |
| 2006/0113184 A1 | 6/2006 | Park | |
| 2007/0279884 A1* | 12/2007 | Hardt | H05K 7/1487 361/796 |
| 2008/0007931 A1* | 1/2008 | Hartman | H05K 7/142 361/810 |
| 2010/0200273 A1 | 8/2010 | Seil | |
| 2014/0160715 A1* | 6/2014 | Wacker | H01M 2/30 361/810 |

\* cited by examiner

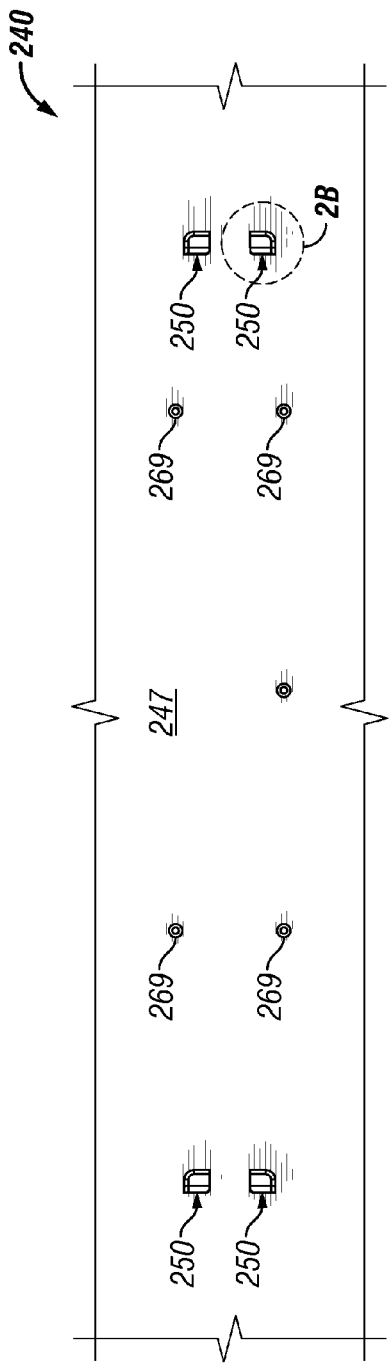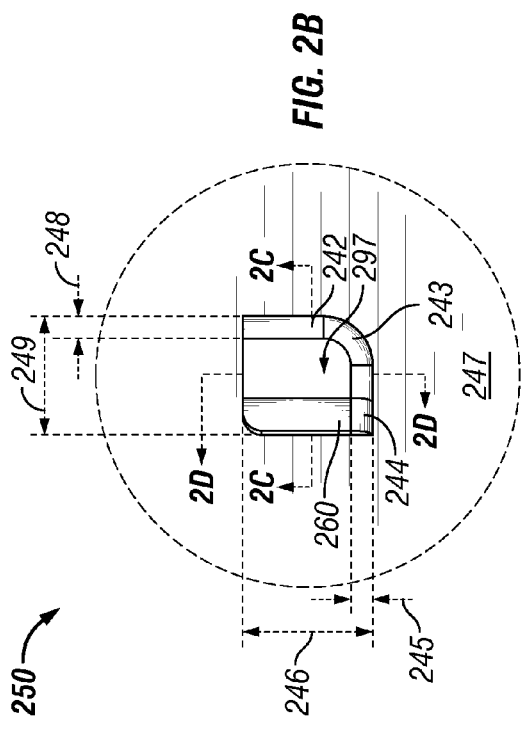

SLIDE LOCK FOR CIRCUIT BOARDS

TECHNICAL FIELD

Embodiments described herein relate generally to circuit boards, and more particularly to systems, methods, and devices for securing circuit boards within an enclosure.

BACKGROUND

Circuit boards are used in a wide variety of applications. In many cases, a circuit board is secured within an enclosure. Securing a circuit board within an enclosure can be a time-consuming process that can also require additional parts and/or other materials. Thus, securing a circuit board to an enclosure, while necessary for a device to function properly, adds to the cost of that device.

SUMMARY

In general, in one aspect, the disclosure relates to a circuit board. The circuit board can include a body and at least one first enclosure coupling feature disposed in at least one outer side of the body. Each first enclosure coupling feature can include at least one protruding section disposed adjacent to the at least one outer side of the body, where the at least one protruding section is configured to couple to at least one first circuit board coupling feature of an enclosure. Each first enclosure coupling feature can also include at least one recessed section disposed adjacent to the at least one protruding section. The at least one protruding section and the at least one recessed section can form an aperture that traverses a thickness of the body.

In another aspect, the disclosure can generally relate to an enclosure configured to receive at least one circuit board. The enclosure can include at least one wall that includes an inner surface and an outer surface. The enclosure can also include at least one first circuit board coupling feature raised from the inner surface of the at least one wall. Each first circuit board coupling feature can include a first open side, a second open side, a first closed side, and a top positioned adjacent to the first open side, the second open side, and the first closed side.

In yet another aspect, the disclosure can generally relate to an electrical device that includes an enclosure and a circuit board removably coupled to the enclosure. The enclosure of the electrical device can include at least one wall that includes an inner surface and an outer surface. The enclosure of the electrical device can also include at least one first circuit board coupling feature raised from the inner surface of the at least one wall. Each first circuit board coupling feature of the enclosure can include a first open side, a second open side, a first closed side, and a top positioned adjacent to the first open side, the second open side, and the first closed side. The circuit board of the electrical device can include a body and at least one first enclosure coupling feature disposed in at least one outer side of the body. Each first enclosure coupling feature of the circuit board can include at least one protruding section disposed adjacent to the at least one outer side of the body, where the at least one protruding section is coupled to the at least one first circuit board coupling feature of the enclosure. Each first enclosure coupling feature of the circuit board can also include at least one recessed section disposed adjacent to the at least one protruding section. The at least one protruding section and the at least one recessed section can form an aperture that traverses a thickness of the body of the circuit board.

These and other aspects, objects, features, and embodiments will be apparent from the following description and the appended claims.

BRIEF DESCRIPTION OF THE DRAWINGS

The drawings illustrate only example embodiments of slide locks for circuit boards and are therefore not to be considered limiting of its scope, as slide locks for circuit boards may admit to other equally effective embodiments. The elements and features shown in the drawings are not necessarily to scale, emphasis instead being placed upon clearly illustrating the principles of the example embodiments. Additionally, certain dimensions or positionings may be exaggerated to help visually convey such principles. In the drawings, reference numerals designate like or corresponding, but not necessarily identical, elements.

FIGS. 2A-2D show various views of a wall of an enclosure in accordance with certain example embodiments.

DETAILED DESCRIPTION OF EXAMPLE EMBODIMENTS

Figure 1A:
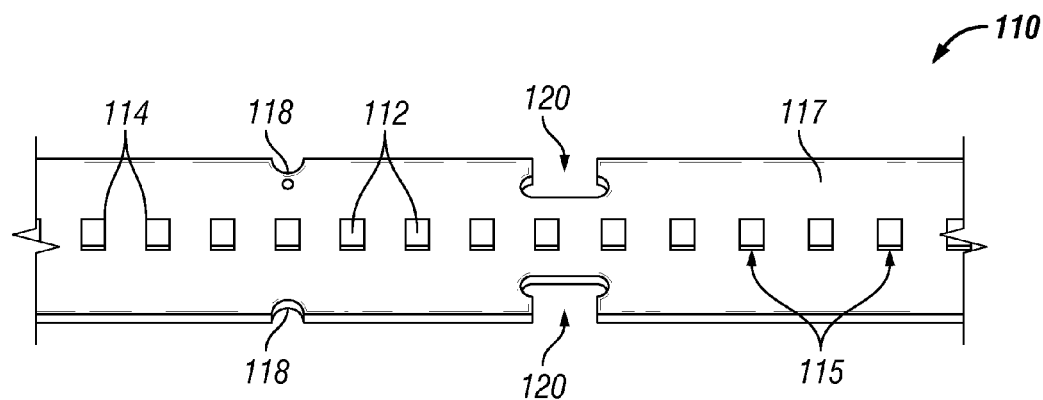
FIGS. 1A and 1B show various views of a circuit board in accordance with certain example embodiments.

The example embodiments discussed herein are directed to systems, methods, and devices for slide locks for circuit boards. While example embodiments are directed herein to circuit boards that couple to walls of an enclosure, example circuit boards can be coupled to any other type of surface to which a circuit board can be mounted. Example embodiments can be used with lighting fixtures that are located in a variety of indoor and outdoor environments. As used herein, a lighting fixture (e.g., a LED floodlight) (also sometimes called a light fixture) can be an entire fixture, a part of a fixture (e.g., a module among multiple modules of a fixture), or any other component of a fixture.

In one or more example embodiments, an enclosure in which an example circuit board is mounted is subject to meeting certain standards and/or requirements set by one or more of a number of authorities. Examples of such authorities include, but are not limited to, the National Electric Code (NEC), the Canadian Electric Code (CEC), the International Electrotechnical Commission (IEC), the National Electrical Manufacturers Association (NEMA), Underwriter's Laboratories (UL), the Standards Council of Canada, Conformité Européenne (CE), and the Appareils destinés à être utilisés en Atmosphères Explosives (ATEX). The example embodiments described herein can allow each enclosure to continue to meet such standards and/or regulations.

The example circuit boards (or components thereof) described herein can be made of one or more of a number of suitable materials to allow the circuit boards (or enclosure in which the circuit boards are mounted) to meet certain standards and/or regulations while also maintaining durability in light of the one or more conditions under which the circuit boards can be exposed. Examples of such materials can include, but are not limited to, aluminum, stainless steel, fiberglass, plastic, nylon, and rubber.

An example circuit board can have one or more of any of a number of components disposed thereon. Examples of such components can include, but are not limited to, an integrated circuit, a light source, a light engine, a resistor, a capacitor, a terminal block, and an electrical lead. If the circuit board includes a light source, the light source can be any of a number of different types of light sources. Examples of a light source can include, but are not limited to, light-emitting diodes (LEDs) and organic LEDs (OLEDs). The LED light sources described herein may include any type of LED technology, including, but not limited to, chip on board and discrete die.

A user may be any person that interacts with a circuit board using example embodiments described herein. Specifically, a user may install, maintain, operate, and/or interface with a circuit board and/or enclosure in which a circuit board is mounted. Examples of a user may include, but are not limited to, an engineer, an electrician, an instrumentation and controls technician, a mechanic, an operator, a consultant, a contractor, and a manufacturer's representative.

Example circuit boards and/or enclosures, or portions thereof, described herein can be made from a single piece (as from a mold, injection mold, die cast, or extrusion process). For example, layered circuit boards can be made from roll formed metal and/or layered fiberglass materials. In addition, or in the alternative, example embodiments of circuit boards and/or enclosures can be made from multiple pieces that are mechanically coupled to each other. In such a case, the multiple pieces can be mechanically coupled to each other using one or more of a number of coupling methods, including but not limited to epoxy, welding, fastening devices, compression fittings, mating threads, and slotted fittings. One or more pieces that are mechanically coupled to each other can be coupled to each other in one or more of a number of ways, including but not limited to fixedly, hingedly, removeably, slidably, and threadably.

Components and/or features described herein can include elements that are described as coupling, fastening, securing, abutting, or other similar terms. Such terms are merely meant to distinguish various elements and/or features within a component or device and are not meant to limit the capability or function of that particular element and/or feature. For example, a feature described as a "coupling feature" can couple, secure, fasten, abut, and/or perform other functions aside from, or in addition to, merely coupling.

A coupling feature (including a complementary coupling feature) as described herein can allow one or more components (e.g., a circuit board) and/or portions thereof to become mechanically coupled, directly or indirectly, to a wall of an enclosure. A coupling feature can include, but is not limited to, a clamp, a portion of a hinge, an aperture, a recessed area, a protrusion, a slot, a spring clip, a tab, a detent, a threaded coupling, and mating threads. One portion of an example circuit board can be coupled to a wall of an enclosure by the direct use of one or more coupling features. In addition, or in the alternative, a portion of an example circuit board can be coupled to a wall of an enclosure using one or more independent devices that interact with one or more coupling features disposed on a component of the circuit board and/or enclosure. Examples of such devices can include, but are not limited to, a pin, a hinge, a fastening device (e.g., a bolt, a screw, a rivet), and a spring.

One coupling feature described herein can be the same as, or different than, one or more other coupling features described herein. A complementary coupling feature as described herein can be a coupling feature that mechanically couples, directly or indirectly, with another coupling feature. For any figure shown and described herein, one or more of the components may be omitted, added, repeated, and/or substituted. Accordingly, embodiments shown in a particular figure should not be considered limited to the specific arrangements of components shown in such figure. For example, features shown in one or more figures or described with respect to one embodiment can be applied to another embodiment associated with a different figure or description.

Further, if a component of a figure is described but not expressly shown or labeled in that figure, the label used for a corresponding component in another figure can be inferred to that component. Conversely, if a component in a figure is labeled but not described, the description for such component can be substantially the same as the description for the corresponding component in another figure. The numbering scheme for the various components in the figures herein is such that each component is a three digit number and corresponding components in other figures have the identical last two digits.

Example embodiments will be described more fully hereinafter with reference to the accompanying drawings, in which example embodiments are shown. Example embodiments may, however, be embodied in many different forms and should not be construed as limited to those set forth herein. Rather, these example embodiments are provided so that this disclosure will be thorough and complete, and will fully convey the scope of slide locks for circuit boards to those or ordinary skill in the art. Like, but not necessarily the same, elements (also sometimes called components or features) in the various figures are denoted by like reference numerals for consistency.

Terms such as "first", "second", "side", "top", "open", "closed", and "within" are used merely to distinguish one component (or part of a component or state of a component) from another. Such terms are not meant to denote a preference or a particular orientation, and are not meant to limit example embodiments. In the following detailed description of the example embodiments, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

Figure 1B:
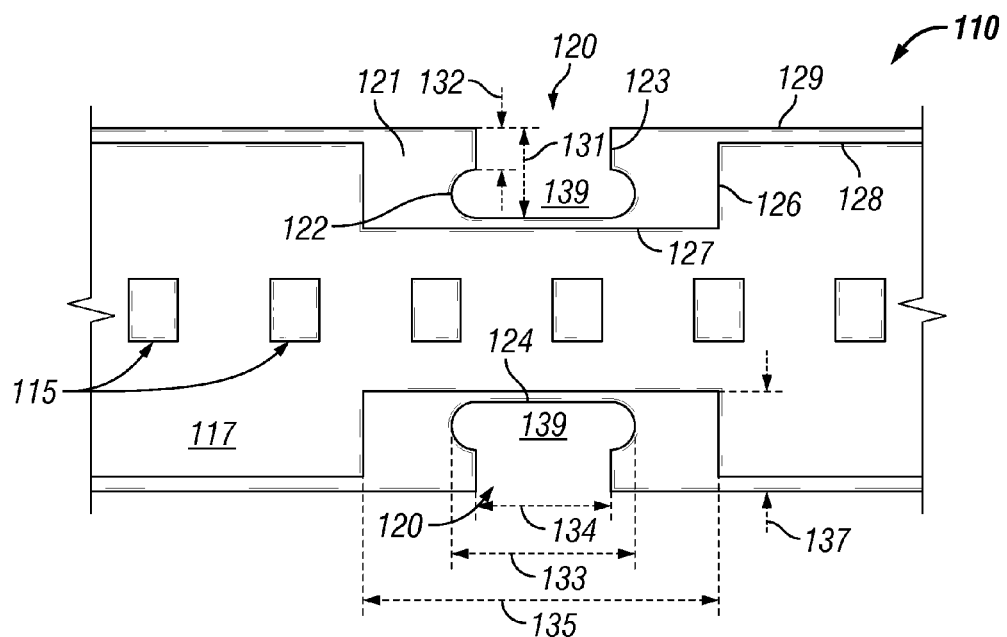

FIGS. 1A and 1B show top views of a circuit board 110 in accordance with certain example embodiments. Specifically, FIG. 1A shows a top view of a portion of a circuit board 110 that includes two example enclosure coupling features 120, and FIG. 1B shows a detailed top view of the two example enclosure coupling features 120 of FIG. 1A.

Referring now to FIGS. 1A and 1B, the circuit board 110 is a medium that includes, and on which are disposed, one or more of a number of discrete components (e.g., capacitor, power terminal, power terminal, resistor, light assembly 115) and/or one or more integrated circuits that are interconnected with each other by a number of wire traces embedded in the circuit board 110. The circuit board 110 can be called one or more of a number of other names, including but not limited to a board, a wiring board, a printed wiring board, a PWB, a printed circuit board, and a PCB.

As shown in FIGS. 1A and 1B, the circuit board 110 includes multiple light assemblies 115. In this case, the light assemblies 115 are disposed on a top surface of the body 117 of the circuit board 110. The components and/or configuration of each light assembly 115 can vary. For example, as shown in FIGS. 1A and 1B, each light assembly 115 can include one or more light sources 112 mounted on one or more light source receivers 114. When the circuit board 110 has multiple light assemblies 115, as shown in FIGS. 1A and 1B, the light assemblies 115 can be arranged in one or more of a number of arrays or other configurations. Control and/or power signals (e.g., voltage, current) are delivered to the circuit board 110 by a power source (e.g., a LED driver (not shown) located within, on, and/or external to the enclosure. Such power and/or control signals can be used to illuminate the light assemblies 115 of the circuit board 110.

The light assemblies 115 can be electrically coupled to each other. For example, the light assemblies 115 can be series-connected in some way (e.g., row-to-row serpentine, column-to-column serpentine). Further, one or more light assemblies 115 in one array can be electrically coupled to one or more light assemblies 115 in another (e.g., an adjacent) array so that a single feed of power to a circuit board 110 can provide sufficient power to all light assemblies 115 disposed on the circuit board 110.

The circuit board 110 can include one or more of a number of coupling features that allow the circuit board 110 to mechanically couple to one or more portions (e.g., a wall) of an enclosure. For example, as shown in FIGS. 1A and 1B, the circuit board 110 can include a number of enclosure coupling features 120. In this case, the enclosure coupling features 120 are formed in pairs on either side of the body 117 of the circuit board 110. This symmetric configuration of enclosure coupling features 120 along the length of the body 117 of the circuit board 110 can be replaced by other configurations, such as a single enclosure coupling feature 120 or a random placement of enclosure coupling features 120 along one or more outer sides 129 of the body 117 of the circuit board 110.

An enclosure coupling feature 120 can have one or more of a number of configurations. For example, as shown in FIGS. 1A and 1B, the enclosure coupling feature 120 can include at least one protruding section 123 and at least one recessed section 122. In such a case, each protruding section 123 can be located adjacent to the outer side 129 (edge) of the body 117 of the circuit board 110. The protruding section 123 of the enclosure coupling feature 120 can have any one or more of a number of shapes and/or sizes to couple to another coupling feature (e.g., a circuit board coupling feature 250, described below with respect to FIGS. 2A-2D) of another component (e.g., a wall 247 of an enclosure 240). For example, in this case, each protruding section 123 is a linear (planar) segment that is substantially perpendicular to the adjacent outer side 129 of the body 117 of the circuit board 110.

Examples of other shapes of the protruding section 123 can include, but are not limited to, a curved shape, a sawtooth shape, a squared shape, and a random shape. In certain example embodiments, an enclosure coupling feature 120 has two protruding sections 123 that are arranged as mirror images of each other at a distance 134 apart from each other. Using such a configuration, the orientation of the circuit board 110 relative to the enclosure to which the circuit board 110 is coupled can be flexible, allowing for more than one orientation between the two components of an electrical device.

Each recessed section 122 of an enclosure coupling feature 120 can be located adjacent to a protruding section 123 of the enclosure coupling feature 120. As with the protruding sections 123, a recessed section 122 of the enclosure coupling feature 120 can have any one or more of a number of shapes and/or sizes to couple to (or facilitate the protruding section 123 to couple to) another coupling feature of another component. For example, in this case, each recessed section 122 is a curved (e.g., semi-circular) segment. In certain example embodiments, an enclosure coupling feature 120 has two recessed sections 122 that are arranged as mirror images of each other at a distance 133 apart from each other. In such a case, the distance 133 separating the recessed sections 122 is greater than the distance 134 separating the protruding sections 123.

The proximal end of the recessed sections 122 can be defined by edge 124, which can be substantially parallel to the outer side 129 of the body 117 of the circuit board 110. An enclosure coupling feature 120 can traverse the entire thickness of the body 117 of the circuit board 110. In such a case, the enclosure coupling feature 120 forms a cavity 139. The shape and size of the cavity 139 is defined by the one or more recessed sections 122 and the one or more protruding sections 123 of the enclosure coupling feature 120.

Since the enclosure coupling feature 120 can incur more mechanical stress compared to other parts of the circuit board 110, as shown in FIG. 1B, an enclosure coupling feature 120 can be disposed on a different portion 121 of the body 117 compared to the parts of the body 117 on which the other components (e.g., light assemblies 115) of the circuit board 110 are disposed. Such a portion 121 of the body 117 can have higher mechanical strength, have different thermal properties, and/or have one or more other characteristics that are different compared to those of the rest of the body 117.

In this case, the portion 121 of the body 117 has a width 135 (defined by side edge 126) and a height 136 (defined by a proximal edge 127 and a distal edge 129) that is greater than the largest width (in this case, distance 133) and the height 131, respectively, of the enclosure coupling feature 120 disposed within the portion 121. The portion 121 can also run, at least in part, continuously along the outer edge of the circuit board 110. In such a case, as shown in FIG. 1B, the outer edge 129 of the portion 121 can extend slightly beyond the outer edge 128 of the body 117 of the circuit board 110.

In certain example embodiments, the circuit board 110 can include one or more other coupling features. For example, as shown in FIGS. 1A and 1B, there can be one or more optional enclosure coupling features 118 disposed in the body 117 of the circuit board 110. The enclosure coupling features 118 can have a different configuration when compared with the enclosure coupling features 120 described above. In this particular case, the enclosure coupling features 118 are apertures that traverse the body 117 of the circuit board 110.

The enclosure coupling features 118 can be disposed at any location along the body 117 of the circuit board 110. In this example, the enclosure coupling features 118 are disposed along the outer edge 129 of the body 117 of the circuit board 110. As such, the enclosure coupling features 118 are semi-circular in shape and sized substantially similar to a fastening device (e.g., a screw, a bolt) that can be disposed therein. The enclosure coupling features 118 can have any of a number of other shapes and/or sizes. Each enclosure coupling feature 118 is configured to couple to, directly or indirectly, with a corresponding circuit board coupling feature of an enclosure.

Figure 2C:
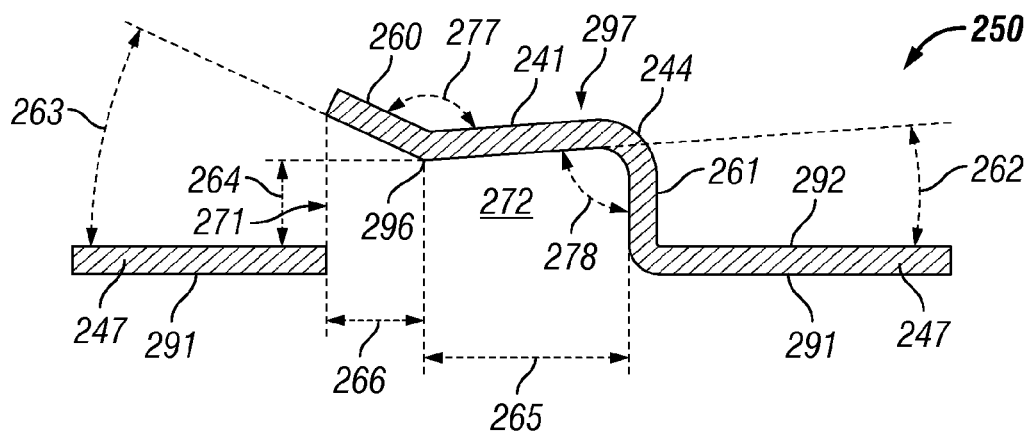
Figure 2D:
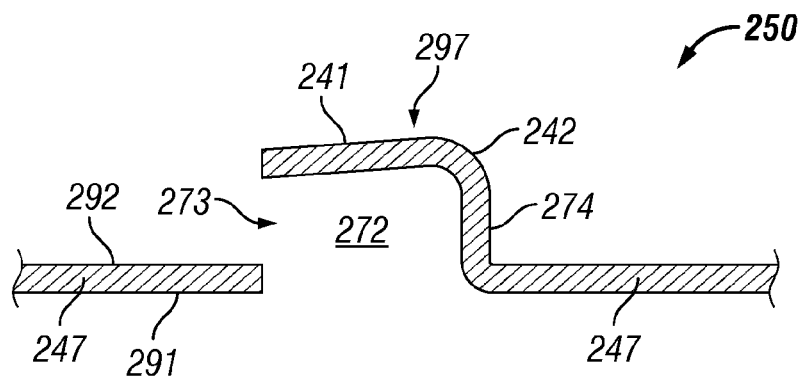
Figure 3:
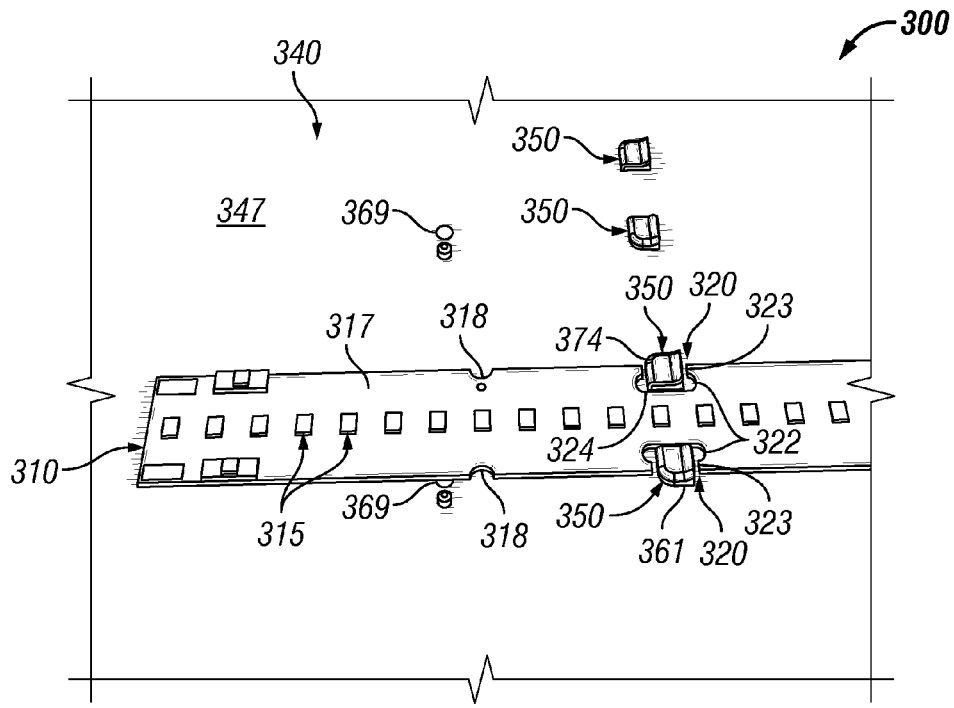
FIGS. 3-5 show an example of an electrical device with a circuit board coupling to an enclosure wall in accordance with certain example embodiments.
Figure 4:
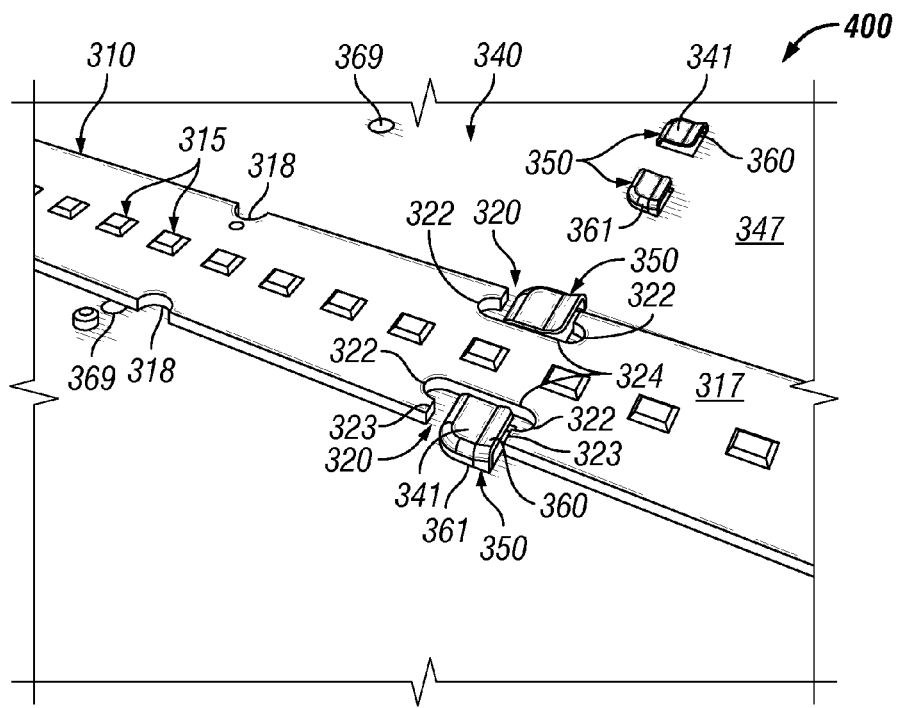
Figure 5:
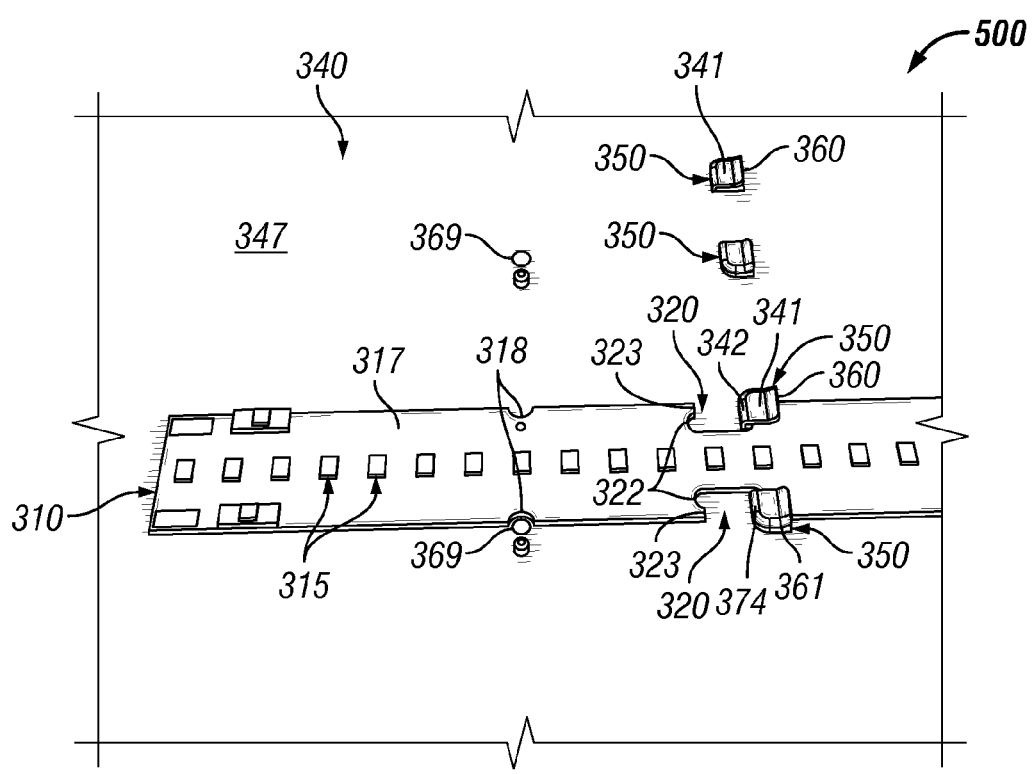

In some cases, as shown in FIGS. 3-5 below, an enclosure coupling feature 118 is only able to couple to a corresponding circuit board coupling feature of an enclosure when the circuit board 110 is aligned in a certain way relative to the wall of the enclosure. For example, an enclosure coupling feature 118 is only able to couple to a corresponding circuit board coupling feature of an enclosure when an enclosure coupling feature 120 is coupled to a corresponding circuit board coupling feature (e.g., circuit board coupling feature 250 of FIGS. 2A-2D) of the enclosure.

In certain example embodiments, where the enclosure coupling features 118 and/or the enclosure coupling features 120 are apertures, such the enclosure coupling features 118 and/or the enclosure coupling features 120 can be cut, stamped, drilled, and/or otherwise formed within the body 117 (or portion thereof, such as portion 121) of the circuit board 110 so that the circuit board 110 is a single piece (or collection of pieces) relative to the enclosure coupling features 118 and/or the enclosure coupling features 120.

FIGS. 2A-2D show various views of a wall of an enclosure in accordance with certain example embodiments. Specifically, FIG. 2A shows a top view of a portion of a wall 247 of an enclosure 240. FIG. 2B shows a top view of a detail of a circuit board coupling feature 250 disposed in the wall 247 of the enclosure 240. FIGS. 2C and 2D show cross-sectional side views of a detail of the circuit board coupling feature 250. Referring to FIGS. 1A-2D, the wall 247 of the enclosure 240 can have an inner surface 292 and an outer surface 291, where the inner surface is directly exposed to a circuit board (e.g., circuit board 110) that is coupled thereto.

The enclosure 240 (also called an electrical enclosure 240 herein) can be any type of cabinet or housing inside of which is disposed one or more electrical devices. Such electrical devices can include, but are not limited to, a circuit board (e.g., circuit board 110), variable frequency drives (VFDs), controllers, relay coils, contactors, transformers, inverters, converters, fuses, electrical cables, and electrical conductors. An electrical enclosure 240 can be completely enclosed, partially enclosed, partially open, or completely open. An electrical enclosure 240 can have one or more covers that are removable, allowing access to an interior of the electrical enclosure 240. Examples of an electrical enclosure 240 can include, but are not limited to, a light fixture, an electrical connector, a junction box, a motor control center, a breaker cabinet, an electrical housing, a conduit, a control panel, an indicating panel, and a control cabinet.

The wall 247 of the enclosure 240 can include one or more of a number of coupling features that allow the wall 247 to mechanically couple to one or more portions (e.g., a wall) of the enclosure 240. For example, as shown in FIGS. 2A-2D, the wall 247 can include a number of circuit board coupling features 250. In this case, the circuit board coupling features 250 are formed in pairs along various portions of the wall 247 of the enclosure 240. This configuration of circuit board coupling features 250 is designed to correspond to the configuration of one or more enclosure coupling features (e.g., enclosure coupling features 120) of a circuit board (e.g., circuit board 110) that are coupled to and disposed within the enclosure 240. Thus, the configuration of circuit board coupling features 250 shown in FIG. 2A can be replaced by other configurations, such as a single circuit board coupling feature 250 or a random placement of circuit board coupling features 250 along the wall 247 of the enclosure 240.

A circuit board coupling features 250 can have one or more of a number of configurations. For example, as shown in FIGS. 2A-2D, each of the circuit board coupling features 250 can be raised from the inner surface 292 of the wall 247 of the enclosure 240. In this case, each circuit board coupling feature 250 includes a first open side 271, a second open side 273 adjacent to the first open side 271, a first closed side 261 adjacent to the second open side 273 and opposite the first open side 271, and a second closed side 274 adjacent to the first open side 271 and the first closed side 261 and opposite the second open side 273.

Each circuit board coupling feature 250 of FIGS. 2A-2D also includes a top 297 that is adjacent to the first open side 271, the second open side 273, the first closed side 261, and the second closed side 274. In such a case, the top 297 can be coupled to (or an extension of) the first closed side 261 and the second closed side 274. When the top 297 is an extension of the first closed side 261, transition piece 244 can be disposed between the top 297 and the first closed side 261. When the top 297 is an extension of the second closed side 274, transition piece 242 can be disposed between the top 297 and the second closed side 274. In any case, the top 297, the first closed side 261, and the second closed side 274 can form a cavity 272.

The top 297 of the circuit board coupling feature 250 can have multiple portions and/or features. For example, as shown in FIGS. 2A-2D, the top 297 can have a tapered distal end 260 and a main portion 241 (also called a remainder 241). In such a case, the tapered distal end 260 can have a length 266, and the remainder 241 can have a length 265. The various portions and/or features of the top 297 can be designed to receive an enclosure coupling feature (e.g., enclosure coupling feature 120) of a circuit board (e.g., circuit board 110) when the circuit board 110 is coupled to the wall 247 of the enclosure 240.

For example, as shown in FIGS. 2A-2D, the tapered distal end 260 can help an enclosure coupling feature (e.g., enclosure coupling feature 120) be inserted into or otherwise positioned within the cavity 272 of the circuit board coupling feature 250. Specifically, the tapered distal end 260 of the top 297 can form an obtuse angle 277 (e.g., 151°) relative to the remainder 241 of the top 297. In addition, the tapered distal end 260 can form an acute angle 263 (e.g., 25°) relative to the inner surface 292 of the wall 247 of the enclosure 240.

In addition, or in the alternative, the various portions and/or features of the top 297 can be designed to retain an enclosure coupling feature (e.g., enclosure coupling feature 120) of a circuit board (e.g., circuit board 110) when the circuit board 110 is coupled to the wall 247 of the enclosure 240. For example, as shown in FIGS. 2A-2D, the bottom side of the junction 296 of the tapered distal end 260 and the remainder 241 of the top 297 can create a friction fit with the enclosure coupling feature 120. For this to occur, the remainder 241 of the top 297 forms an acute angle 278 (e.g., 86°) with the first closed side 261.

In addition, the height of the first closed side 261 can be slightly greater than the thickness of the enclosure coupling feature (e.g., enclosure coupling feature 120) of the circuit board (e.g., circuit board 110) that is disposed in the cavity 272, and the height of the bottom side of the junction 296 (the perpendicular distance between the bottom side of the junction 296 and the top surface 292 of the wall 247) can be slightly less than the thickness of the enclosure coupling feature of the circuit board that is disposed in the cavity 272.

In certain example embodiments, the wall 247 of the enclosure 240 can include one or more other coupling features. For example, as shown in FIG. 2A, there can be one or more optional circuit board coupling features 269 disposed in the wall 247 of the enclosure 240. The circuit board coupling features 269 can have a different configuration when compared with the circuit board coupling features 250 described above. In this particular case, the circuit board coupling features 269 are apertures that traverse some or all of the wall 247 of the enclosure 240.

The circuit board coupling features 269 can be disposed at any location along the wall 247 of the enclosure 240. In this example, the circuit board coupling features 269 are disposed a small distance from the circuit board coupling features 250. The circuit board coupling features 269 can be sized substantially similar to a fastening device (e.g., a screw, a bolt) that can be disposed therein. The circuit board coupling features 269 can have any of a number of other shapes and/or sizes. Each circuit board coupling features 269 is configured to couple to, directly or indirectly, with a corresponding enclosure coupling feature (e.g., enclosure coupling feature 118) of a circuit board.

In some cases, as shown in FIGS. 3-5 below, a circuit board coupling features 269 is only able to couple to a corresponding enclosure coupling feature of a circuit board when the circuit board 110 is aligned in a certain way relative to the wall 247 of the enclosure 240. For example, a circuit board coupling features 269 is only able to couple to a corresponding enclosure coupling feature of a circuit board when an enclosure coupling feature 120 is coupled to a corresponding circuit board coupling feature 250 of the enclosure 240.

In certain example embodiments, where the circuit board coupling features 269 and/or the circuit board coupling features 250 are apertures, such circuit board coupling features 269 and/or the circuit board coupling features 250 can be cut, stamped, extruded, drilled, and/or otherwise formed within the wall 247 (or other portion) of the enclosure 240 so that the wall 247 is a single piece (or collection of pieces) relative to the circuit board coupling features 269 and/or the circuit board coupling features 250.

FIGS. 3-5 show an example of an electrical device in accordance with certain example embodiments. Specifically, FIG. 3 shows a portion of the electrical device 300 in which a circuit board 310 is decoupled from a wall 347 of an enclosure 340. FIG. 4 shows the portion of the electrical device 400 of FIG. 3 in which the circuit board 310 is becoming coupled to the wall 347 of the enclosure 340. FIG. 5 shows the portion of the electrical device 500 of FIGS. 3 and 4 in which the circuit board 310 is coupled to the wall 347 of the enclosure 340.

Referring to FIGS. 1A-5, the electrical device 300 of FIG. 3 includes a circuit board 310 that is substantially the same as the circuit board 110 of FIGS. 1A and 1B. Specifically, the circuit board 310 includes two enclosure coupling features 320 that are aligned with each other along an outer edge of the body 317. The circuit board 310 also includes two other enclosure coupling features 318 that are aligned with each other along an outer edge of the body 317.

In addition, the electrical device of FIG. 3 includes an enclosure 340 that is substantially the same as the enclosure 240 of FIGS. 2A-2D. Specifically, the wall 347 of the enclosure 340 of FIG. 3 includes two circuit board coupling features 350 that are arranged to align with the two enclosure coupling features 320 of the circuit board 310. The wall 347 of the enclosure 340 of FIG. 3 also includes two other circuit board coupling features 369 that are arranged to align with the two enclosure coupling features 318 of the circuit board 310.

In FIG. 3, the circuit board 310 is placed against the wall 347 of the enclosure 340 so that each of the circuit board coupling features 350 of the enclosure 340 are disposed within the cavity 339 of an enclosure coupling feature 320 without any portion of the enclosure coupling feature 320 being disposed within the cavity 272 of the circuit board coupling feature 350. In such a case, the distance 335 between the protruding sections 323 of the enclosure coupling feature 320 is greater than the length (the sum of the length 366 of the tapered distal end 360 and the length 365 of the remainder 341) of the top 397 of the circuit board coupling feature 350.

Also, as shown in FIG. 3, since the circuit board coupling features 350 and the enclosure coupling features 320 are not coupled to each other, the circuit board coupling features 369 and the enclosure coupling features 318 are not aligned with each other. As a result, the circuit board coupling features 369 and the enclosure coupling features 318 of the electrical device 300 of FIG. 3 cannot be coupled to each other.

In FIG. 4, the electrical device 400 is substantially the same as the electrical device 300 of FIG. 3, except that the enclosure coupling features 320 and the circuit board coupling features 350 are beginning to become coupled to each other by sliding the circuit board 310 to the left relative to the wall 347 of the enclosure 340. When this occurs, the protruding portion 323 of the enclosure coupling features 320 become disposed within the cavity 372 of the circuit board coupling features 350. In addition, the circuit board coupling features 369 and the enclosure coupling features 318 of the electrical device 400 of FIG. 4 are drawn closer to each other but still cannot be coupled to each other.

In FIG. 5, the electrical device 500 is substantially the same as the electrical device 400 of FIG. 4, except that the enclosure coupling features 320 and the circuit board coupling features 350 are now fully coupled to each other. This was accomplished by continuing to slide the circuit board 310 to the left relative to the wall 347 of the enclosure 340 until the circuit board 310 cannot slide any further to the left. In such a case, a protruding section 323 of each enclosure coupling feature 320 can abut against the first closed side 261 of the circuit board coupling features 350. When this occurs, the circuit board coupling features 350 (e.g., the junction 396 of the tapered distal end 360 and the remainder 341 of the top 397) can secure the circuit board 310 by imposing a friction fit against the protruding section 323 of the enclosure coupling features 320.

In certain example embodiments, the protruding section 323 of an enclosure coupling feature 320 can include one or more features (e.g., a notch, a detent, a recess) disposed along its top surface to receive the junction 396 of the top 397 of the circuit board coupling feature 350 when the circuit board 310 is properly aligned relative to the wall 347 of the enclosure 340. In addition, because the circuit board coupling features 350 and the enclosure coupling features 320 of the electrical device 500 of FIG. 5 are fully coupled to each other, the circuit board coupling features 369 and the enclosure coupling features 318 are aligned with each other and can be coupled to each other. In such a case, a fastening device (not shown) can be used to couple a circuit board coupling feature 369 and an enclosure coupling feature 318 together.

Figure 6A:
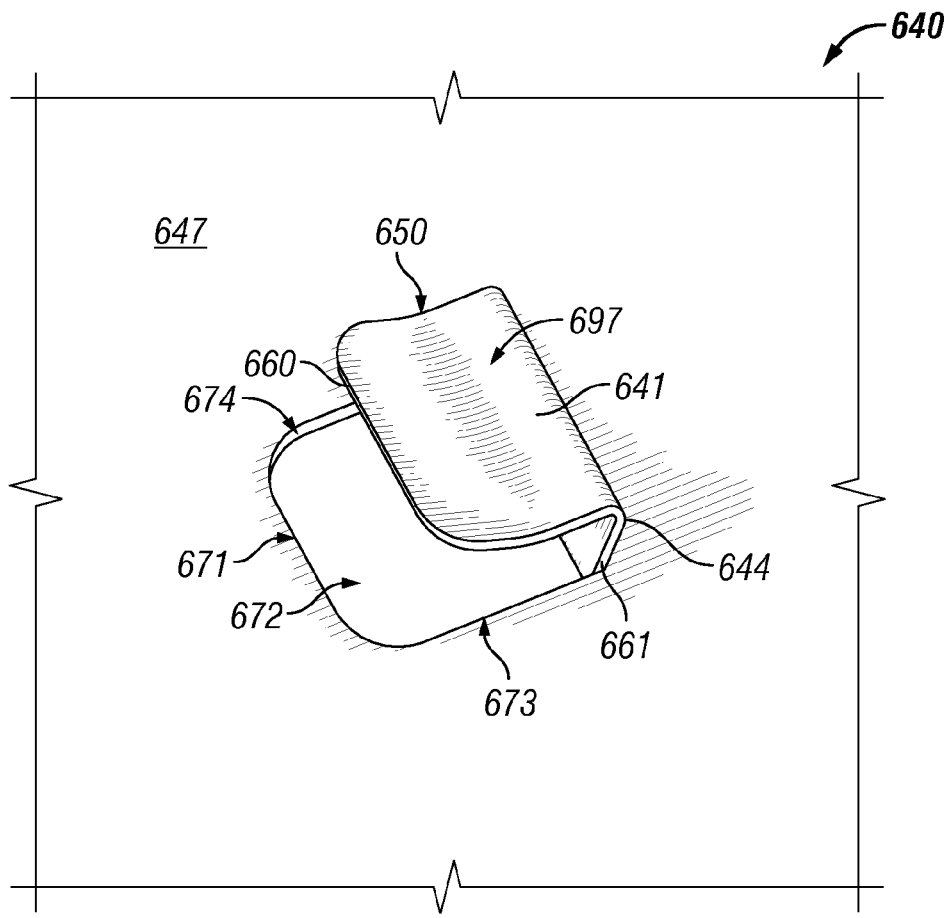
FIGS. 6A and 6B show various views of a wall of an enclosure in accordance with certain example embodiments.
Figure 6B:
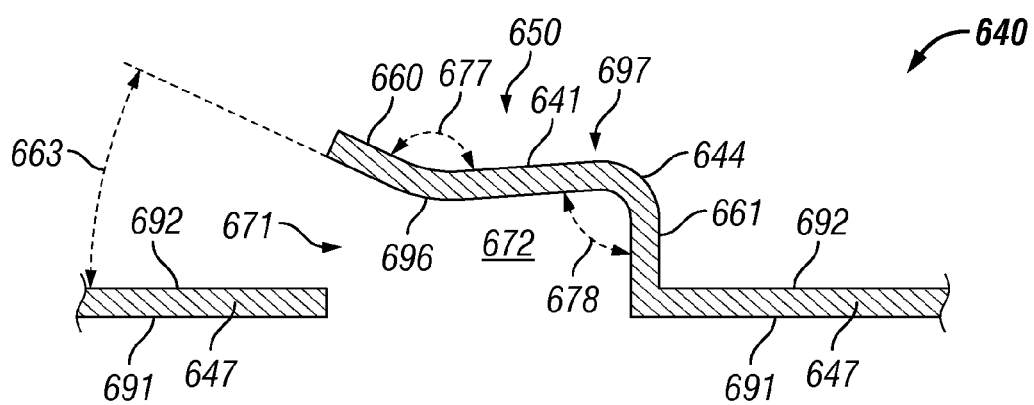

FIGS. 6A and 6B show various views of a wall 647 of an enclosure 640 in accordance with certain example embodiments. Specifically, FIG. 2A shows a top-side perspective view of a portion of a wall 247 of an enclosure 240. FIG. 2B shows a side view of the portion of the wall 247 of the enclosure 240. Referring to FIGS. 1A-6B, the coupling feature 650 disposed in the wall 647 of the enclosure 640 of FIGS. 6A and 6B can be substantially the same as the coupling feature 250 disposed in the wall 247 of the enclosure 240 of FIGS. 2A-2D, except as described below.

The coupling feature 650 of FIGS. 6A and 6B has only one closed side 661 and three open sides (open side 671, open side 672, and open side 674) rather than two closed sides (closed side 261 and closed side 274) and two open sides (open side 273 and open side 271), as with the coupling feature 250 of FIGS. 2A-2D. This configuration of the circuit board coupling feature 650 is designed to couple to (e.g., receive) one or more enclosure coupling features (e.g., enclosure coupling features 120) of a circuit board (e.g., circuit board 110) that are coupled to and disposed within the enclosure 640. As a result, a coupling feature 650 can be coupled to multiple circuits boards at one time. An example of this is shown below with respect to FIGS. 7 and 8.

In this case, the circuit board coupling feature 650 includes a first open side 671, a second open side 673 adjacent to the first open side 671, a closed side 661 adjacent to the second open side 673 and opposite the first open side 671, and a third open side 674 adjacent to the first open side 671 and the closed side 661 and opposite the second open side 673. The top 697 is adjacent to the first open side 671, the second open side 673, the closed side 661, and the third open side 674. In this case, the top 697 is coupled to (or an extension of) the closed side 661. Transition piece 644 is disposed between the top 697 and the closed side 661. The top 697 and the closed side 661 form a cavity 672.

As with the top 297 of FIGS. 2A-2D, the top 697 of the circuit board coupling feature 650 of FIGS. 6A and 6B can have multiple portions and/or features. For example, as shown in Figures FIGS. 6A and 6B, the top 697 can have a tapered distal end 660 and a main portion 641 (also called a remainder 641). In such a case, the tapered distal end 660 can have a length 666, and the remainder 641 can have a length 665. The various portions and/or features of the top 697 can be designed to receive an enclosure coupling feature (e.g., enclosure coupling feature 720 of FIGS. 7 and 8 below) of a circuit board (e.g., circuit board 710 of FIGS. 7 and 8 below) when the circuit board is coupled to the wall 647 of the enclosure 640.

For example, as shown in FIGS. 6A and 6B, the tapered distal end 660 can help an enclosure coupling feature of a circuit board be inserted into or otherwise positioned within the cavity 672 of the circuit board coupling feature 650. Specifically, the tapered distal end 660 of the top 697 can form an obtuse angle 677 (e.g., 151°) relative to the remainder 641 of the top 697. In addition, the tapered distal end 660 can form an acute angle 663 (e.g., 25°) relative to the inner surface 692 of the wall 647 of the enclosure 640.

In addition, or in the alternative, the various portions and/or features of the top 697 can be designed to retain an enclosure coupling feature of a circuit board when the circuit board is coupled to the wall 647 of the enclosure 640. For example, as shown in FIGS. 6A and 6B, the bottom side of the junction 696 of the tapered distal end 660 and the remainder 641 of the top 697 can create a friction fit with an enclosure coupling feature. For this to occur, the remainder 641 of the top 697 forms an acute angle 678 (e.g., 86°) with the closed side 661. In addition, the height of the closed side 661 can be slightly greater than the thickness of the enclosure coupling feature of the circuit board that is disposed in the cavity 672, and the height of the bottom side of the junction 696 (the perpendicular distance between the bottom side of the junction 696 and the top surface 692 of the wall 647) can be slightly less than the thickness of the enclosure coupling feature of the circuit board that is disposed in the cavity 672.

Figure 7:
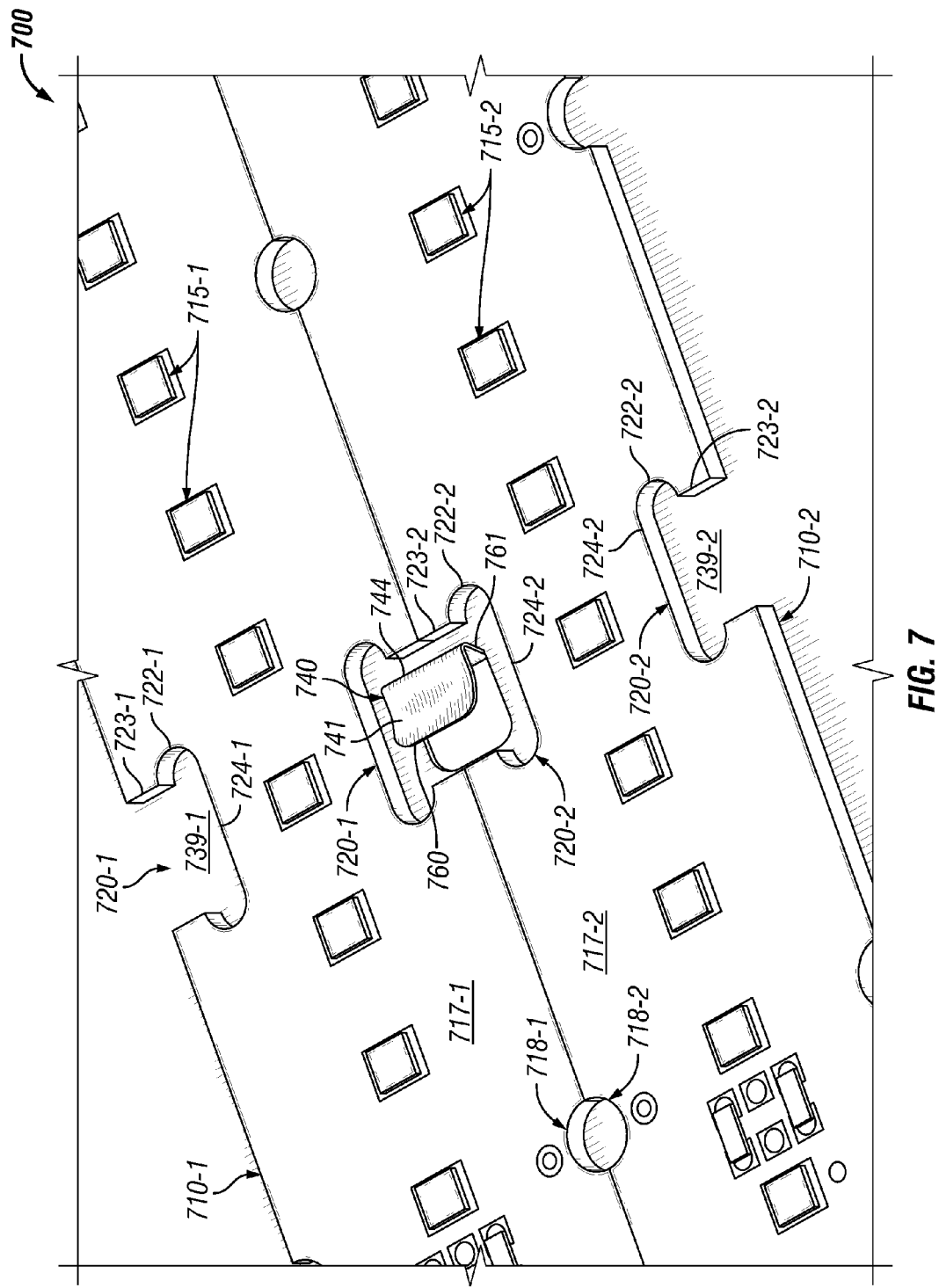
FIGS. 7 and 8 show an example of an electrical device with multiple circuit boards coupling to an enclosure wall in accordance with certain example embodiments.
Figure 8:
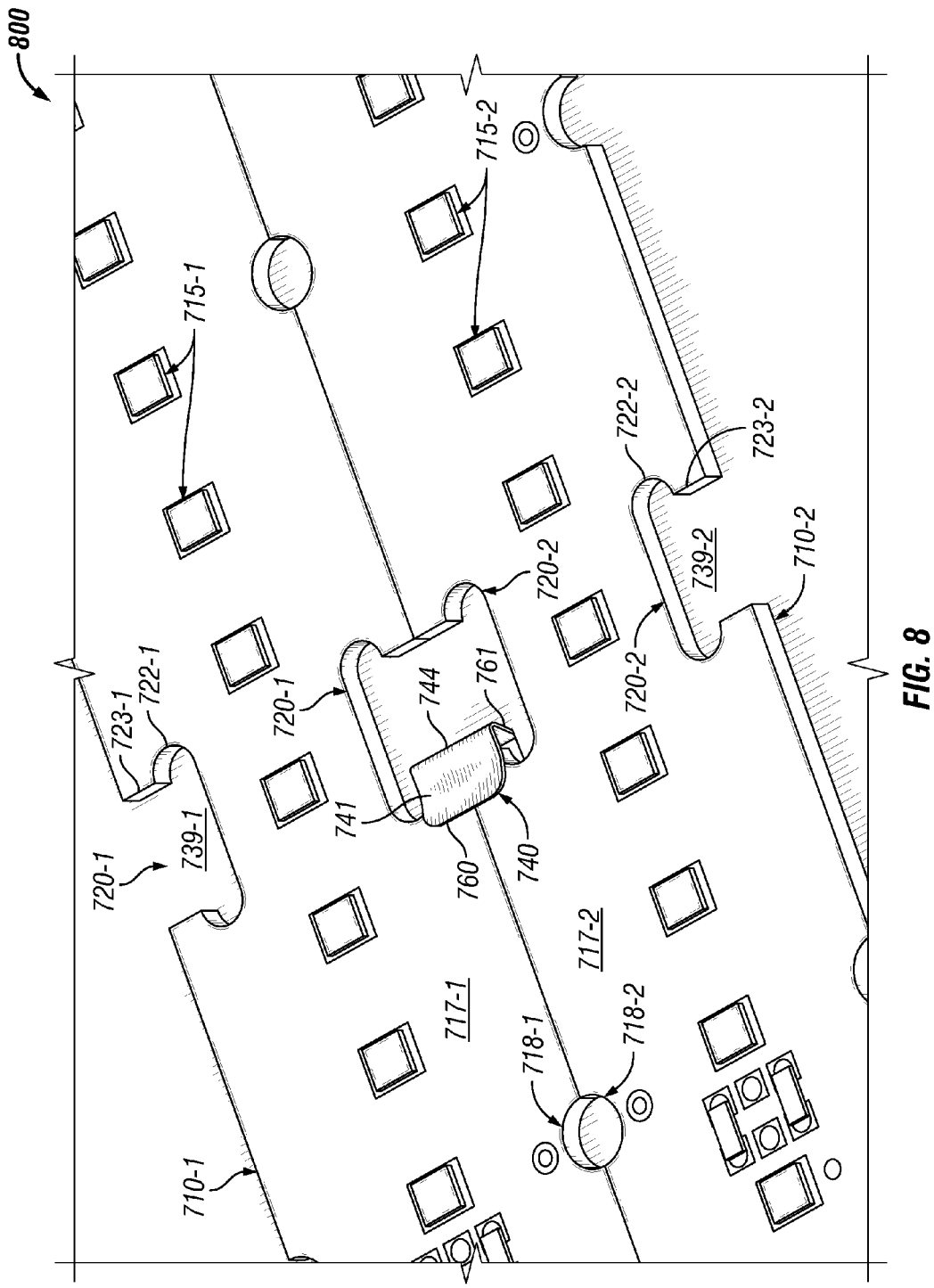

FIGS. 7 and 8 show another example of an electrical device with two circuit boards 710 coupling to an enclosure wall 747 in accordance with certain example embodiments. Referring to FIGS. 1A-8, with respect to FIGS. 7 and 8, there are two substantially similar circuit boards 710 (circuit board 710-1 and circuit board 710-2), where each circuit board 710 has multiple enclosure coupling features 720 that are all configured substantially identically. Also, while each circuit board 710 includes enclosure coupling features 718, the enclosure 740 does not have any corresponding circuit board coupling features (such as circuit board coupling features 269 of FIG. 2A) that couple to the enclosure coupling features 718.

In this case, both circuit boards 710 of the electrical device 700 of FIG. 7 are placed against the wall 747 of the enclosure 740 so that the circuit board coupling feature 750 of the enclosure 740 is disposed within the cavity 739 of an enclosure coupling feature 720 of each circuit board 710 without any portion of the enclosure coupling features 720 being disposed within the cavity 772 of the circuit board coupling feature 750. In such a case, the distance between the protruding sections 723 of each enclosure coupling feature 720 is greater than the length (the sum of the length 766 of the tapered distal end 760 and the length 765 of the remainder 741) of the top 797 of each circuit board coupling feature 750.

In FIG. 8, the electrical device 800 is substantially the same as the electrical device 700 of FIG. 7, except that the enclosure coupling features 720 and the circuit board coupling feature 750 are now fully coupled to each other. This was accomplished by continuing to slide the circuit boards 710 to the left relative to the wall 747 of the enclosure 740 until the circuit boards 710 cannot slide any further to the left. In such a case, a protruding section 723 of each enclosure coupling feature 720 can abut against the closed side 761 of the circuit board coupling feature 750. When this occurs, the circuit board coupling feature 750 (e.g., the junction 796 of the tapered distal end 760 and the remainder 741 of the top 797) can secure the circuit boards 710 by imposing a friction fit against the protruding section 723 of the enclosure coupling features 720.

In one or more example embodiments, example embodiments described herein can be used to more efficiently and effectively couple a circuit board to an enclosure. Example embodiments can be used to reduce time of production, reduce materials and labor, and at least maintain reliability of an electrical device. In addition, example embodiments can allow for a flexible arrangement of one or more circuit boards within an enclosure. One or more industry standards that apply to an electrical device can be met using example embodiments described herein.

Accordingly, many modifications and other embodiments set forth herein will come to mind to one skilled in the art to which slide locks for circuit boards pertain having the benefit of the teachings presented in the foregoing descriptions and the associated drawings. Therefore, it is to be understood that slide locks for circuit boards are not to be limited to the specific embodiments disclosed and that modifications and other embodiments are intended to be included within the scope of this application. Although specific terms are employed herein, they are used in a generic and descriptive sense only and not for purposes of limitation.

What is claimed is:
1. An electrical device, comprising:
an enclosure comprising:

at least one wall comprising an inner surface and an outer surface; and at least one first circuit board coupling feature unitary with and raised from the inner surface of the at least one wall to form a cavity, wherein each first circuit board coupling feature of the at least one first circuit board coupling feature comprises:
a first open side;
a second open side;
a first closed side; and
a top positioned adjacent to the first open side, the second open side, and
the first closed side; and a circuit board removably coupled to the enclosure, wherein the circuit board comprises:
a body defined by at least one outer side, a top surface, and a bottom surface, wherein the top surface and the bottom surface are adjacent to the at least one outer side, and wherein the top surface and the bottom surface are opposite each other and form a thickness; and at least one first enclosure coupling feature unitary with the body, wherein each first enclosure coupling feature of the at least one first enclosure coupling feature comprises:
at least one protruding section unitary with and disposed adjacent to the at least one outer side of the body, wherein the at least one protruding section is coupled to the at least one first circuit board coupling feature of the enclosure; and
at least one recessed section disposed adjacent to and unitary with the at least one protruding section, wherein the at least one recessed section is disposed in the body away from the at least one outer side, and wherein the at least one
recessed section is further disposed a distance from the at least one protruding section as measured along the at least one outer side of the body, wherein the at least one protruding section and the at least one recessed section form an aperture that traverses the thickness of the body of the circuit board, wherein the at least one protruding section slides into the cavity to couple the circuit board to the enclosure, and wherein the at least one protruding section is capable of sliding out of the cavity to decouple the circuit board from the enclosure.

2. The electrical device of claim 1, wherein the top of the first circuit board coupling feature forms an acute angle with the first closed side.

3. The electrical device of claim 2, wherein the top of the first circuit board coupling feature comprises a tapered distal end that forms an obtuse angle with a remainder of the top, wherein the top imposes a friction fit on the at least one protruding section of the first enclosure coupling feature at a junction of the tapered distal end of the first circuit board coupling feature and the remainder of the first circuit board coupling feature.

4. The electrical device of claim 1, wherein at least one second circuit board coupling feature and at least one second enclosure coupling feature couple to each other when the first enclosure coupling feature couples to the first circuit board coupling feature.

5. The electrical device of claim 4, further comprising:
a fastening device disposed within the at least one second circuit board coupling feature and the at least one second enclosure coupling feature.

6. An electrical device, comprising:
an enclosure comprising:
at least one wall comprising an inner surface and an outer surface; and
at least one first circuit board coupling feature unitary with and raised from the inner surface of the at least one wall to form a cavity, wherein each first circuit board coupling feature of the at least one first circuit board coupling feature comprises:
a first open side;
a second open side;
a first closed side; and
a top positioned adjacent to the first open side, the second open side, and the first closed side; and a circuit board removably coupled to the enclosure, wherein the circuit board comprises:
a body defined by at least one outer side, a top surface, and a bottom surface, wherein the top surface and the bottom surface are adjacent to the at least one outer side, and wherein the top surface and the bottom surface are opposite each other and form a thickness; and at least one first enclosure coupling feature unitary with the body, wherein each first enclosure coupling feature of the at least one first enclosure coupling feature comprises:
at least one protruding section unitary with and disposed adjacent to the at least one outer side of the body, wherein the at least one protruding section is coupled to the at least one first circuit board coupling feature of the enclosure; and
at least one recessed section disposed adjacent to and unitary with the at least one protruding section, wherein the at least one recessed section is recessed in a direction in which the at least one protruding section couples to the at least one first circuit board coupling feature of the enclosure,
wherein the at least one protruding section and the at least one recessed section form an aperture that traverses the thickness of the body of the circuit board,
wherein the at least one protruding section slides into the cavity to couple the circuit board to the enclosure.

7. A light fixture comprising:
a housing comprising:
at least one wall comprising an inner surface and an outer surface; and
at least one first circuit board coupling feature unitary with and raised from the inner surface of the at least one wall to form a cavity, wherein each first circuit board coupling feature of the at least one first circuit board coupling feature comprises:
a first open side;
a second open side;
a first closed side; and
a top positioned adjacent to the first open side, the second open side, and the first closed side; and a circuit board removably coupled to the housing, wherein the circuit board comprises:
a body defined by at least one outer side, a top surface, and a bottom surface, wherein the top surface and the bottom surface are adjacent to the at least one outer side, and wherein the top surface and the bottom surface are opposite each other and form a thickness; and at least one first housing coupling feature unitary with the body, wherein each first housing coupling feature of the at least one first housing coupling feature comprises:

at least one protruding section unitary with disposed adjacent to the at least one outer side of the body, wherein the at least one protruding section is coupled to the at least one first circuit board coupling feature of the housing; and at least one recessed section disposed adjacent to and unitary with the at least one protruding section, wherein the at least one recessed section is recessed in a direction in which the at least one protruding section couples to the at least one first circuit board coupling feature of the housing, wherein the at least one protruding section and the at least one recessed section form an aperture that traverses the thickness of the body of the circuit board, wherein the at least one protruding section slides into the cavity to couple the circuit board to the housing.

* * * * *